(12) United States Patent
Uesaka

(10) Patent No.: US 11,228,297 B2
(45) Date of Patent: Jan. 18, 2022

(54) ELASTIC WAVE DEVICE

(71) Applicant: Murata Manufacturing Co., Ltd., Nagaokakyo (JP)

(72) Inventor: Kenichi Uesaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 663 days.

(21) Appl. No.: 15/828,462

(22) Filed: Dec. 1, 2017

(65) Prior Publication Data

US 2018/0102758 A1 Apr. 12, 2018

Related U.S. Application Data

(63) Continuation of application No. PCT/JP2016/060116, filed on Mar. 29, 2016.

(30) Foreign Application Priority Data

Jun. 8, 2015 (JP) .............................. JP2015-115799

(51) Int. Cl.
| | |
|---|---|
| *H03H 9/10* | (2006.01) |
| *H03H 9/25* | (2006.01) |
| *H01L 23/544* | (2006.01) |
| *H03H 9/02* | (2006.01) |
| *H03H 9/05* | (2006.01) |

(52) U.S. Cl.
CPC ......... *H03H 9/1085* (2013.01); *H01L 23/544* (2013.01); *H03H 9/02559* (2013.01); *H03H 9/059* (2013.01); *H03H 9/25* (2013.01); *H01L 2223/54406* (2013.01); *H01L 2224/16225* (2013.01); *H01L 2924/1815* (2013.01)

(58) Field of Classification Search
CPC .. H03H 9/1085; H03H 9/02559; H03H 9/059; H01L 41/053
USPC ........................................ 310/340, 344, 348
See application file for complete search history.

(56) References Cited

U.S. PATENT DOCUMENTS

| | | | |
|---|---|---|---|
| 2005/0184626 A1* | 8/2005 | Chiba ................. | H03H 9/1021 310/348 |
| 2010/0187675 A1* | 7/2010 | Shimizu ............... | H01L 21/563 257/690 |

(Continued)

FOREIGN PATENT DOCUMENTS

| | | |
|---|---|---|
| JP | 2008-109346 A | 5/2008 |
| JP | 2010-177388 A | 8/2010 |

(Continued)

OTHER PUBLICATIONS

Official Communication issued in International Patent Application No. PCT/JP2016/060116, dated Jun. 14, 2016.

*Primary Examiner* — Derek J Rosenau
(74) *Attorney, Agent, or Firm* — Keating & Bennett, LLP

(57) ABSTRACT

An elastic wave device includes an elastic wave element mounted on a mounting substrate, with the elastic wave element being sealed by a sealing resin layer. The elastic wave element is bonded to electrode lands on the mounting substrate using bumps. Recessed portions are provided on a surface of the sealing resin layer on a side opposite to the side facing the mounting substrate. A ratio D/H between a depth of the recessed portions, and a distance of a portion of the sealing resin layer from the surface to a second main surface of a piezoelectric substrate, is no less than about 1/3.

19 Claims, 5 Drawing Sheets

(56) References Cited

U.S. PATENT DOCUMENTS

| | | | | |
|---|---|---|---|---|
| 2011/0175689 A1* | 7/2011 | Omura | ............... | H03H 9/0576 333/133 |
| 2014/0320234 A1* | 10/2014 | Takemura | ............ | H03H 9/1092 333/133 |
| 2016/0043702 A1* | 2/2016 | Okamoto | ............ | H03H 9/1021 310/348 |

FOREIGN PATENT DOCUMENTS

| | | |
|---|---|---|
| JP | 2011-151553 A | 8/2011 |
| JP | 2014-112607 A | 6/2014 |
| WO | 2013/115115 A1 | 8/2013 |

* cited by examiner

ELASTIC WAVE DEVICE

CROSS REFERENCE TO RELATED APPLICATIONS

This application claims the benefit of priority to Japanese Patent Application No. 2015-115799 filed on Jun. 8, 2015 and is a Continuation Application of PCT Application No. PCT/JP2016/060116 filed on Mar. 29, 2016. The entire contents of each application are hereby incorporated herein by reference.

BACKGROUND OF THE INVENTION

1. Field of the Invention

The present invention relates to an elastic wave device in which an elastic wave element is sealed by a sealing resin layer.

2. Description of the Related Art

Recently, there has been a strong demand for electronic components to be thinner and smaller. Japanese Unexamined Patent Application Publication No. 2014-112607 discloses an elastic wave device with a hollow structure. In Japanese Unexamined Patent Application Publication No. 2014-112607, an elastic wave element is mounted on a mounting substrate using bumps. Interdigital transducer electrodes of the elastic wave element face the mounting substrate. A hollow space is provided between the interdigital transducer electrodes and the mounting substrate. A sealing resin layer is provided so as to cover the periphery of the elastic wave element. The configuration is such that a mark is inscribed on an upper surface of the sealing resin layer using a laser or the like.

With the method in which a mark is inscribed on the upper surface of the sealing resin layer using a laser or the like, the portion that is inscribed becomes recessed. Because a recessed portion is formed, there is a risk that the elastic wave device will break down when subjected to stress caused by heat.

SUMMARY OF THE INVENTION

Preferred embodiments of the present invention provide elastic wave devices that do not easily break down when subjected to stress caused by heat.

An elastic wave device according to a preferred embodiment of the present invention includes a mounting substrate; electrode lands provided on the mounting substrate; an elastic wave element including a piezoelectric substrate with first and second main surfaces opposite to each other and an interdigital transducer electrode provided on the first main surface of the piezoelectric substrate, the elastic wave element being mounted on the mounting substrate such that the first main surface opposes the electrode lands on the mounting substrate with a gap provided therebetween; a plurality of bumps that bond the elastic wave element to the electrode lands; and a sealing resin layer that covers the elastic wave element mounted on the mounting substrate and defines a portion of the gap as a hollow portion. A recessed portion is provided in a surface of the sealing resin layer on a side opposite to the side facing the mounting substrate, with a depth of the recessed portion being no less than about 1/3 of a distance from the second main surface of the piezoelectric substrate to the surface of the sealing resin layer on the side opposite to the side facing the mounting substrate.

In an elastic wave device according to a preferred embodiment of the present invention, when viewed in plan view from the surface of the sealing resin layer on the side opposite to the side facing the mounting substrate, the recessed portion is located between bumps. In this case, a situation in which the device breaks down when thermal stress is exerted thereon is move effectively reduced or prevented.

In an elastic wave device according to a preferred embodiment of the present invention, one of the recessed portions is located between all of the plurality of the bumps. In this case, it is even less likely that the device will break down due to thermal stress.

In an elastic wave device according to a preferred embodiment of the present invention, a base of the recessed portion is located closer to the surface of the sealing resin layer on the side opposite to the side facing the mounting substrate than the second main surface of the piezoelectric substrate, and a portion of the sealing resin layer is disposed between the base of the recessed portion and the second main surface of the piezoelectric substrate. In this case, it is even less likely that the device will break down due to thermal stress.

In an elastic wave device according to a preferred embodiment of the present invention, when viewed in plan view from the surface of the sealing resin layer on the side opposite to the side facing the mounting substrate, the recessed portion is located outside the hollow portion that faces the interdigital transducer electrode. In this case, a decrease in strength is less likely to occur as a result of the recessed portion being provided.

In an elastic wave device according to a preferred embodiment of the present invention, when viewed in plan view from the surface of the sealing resin layer on the side opposite to the side facing the mounting substrate, the recessed portion does not overlap with the interdigital transducer electrode. In this case, a decrease in mechanical strength is even less likely to occur as a result of the recessed portion being provided.

In an elastic wave device according to a preferred embodiment of the present invention, the recessed portion defines or includes alphanumeric characters, for example. In this case, information pertaining to the elastic wave device, manufacturing lot information, or other useful information is able to be displayed using the recessed portion.

According to various preferred embodiments of the present invention, elastic wave devices that do not easily break down when subjected to stress caused by heat is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear through descriptions of specific preferred embodiments of the present invention with reference to the drawings.

Note that the various preferred embodiments disclosed in the present specification are merely examples, and it is to be understood that partial replacements or combinations of configurations among different preferred embodiments are also possible.

Figure 1A:
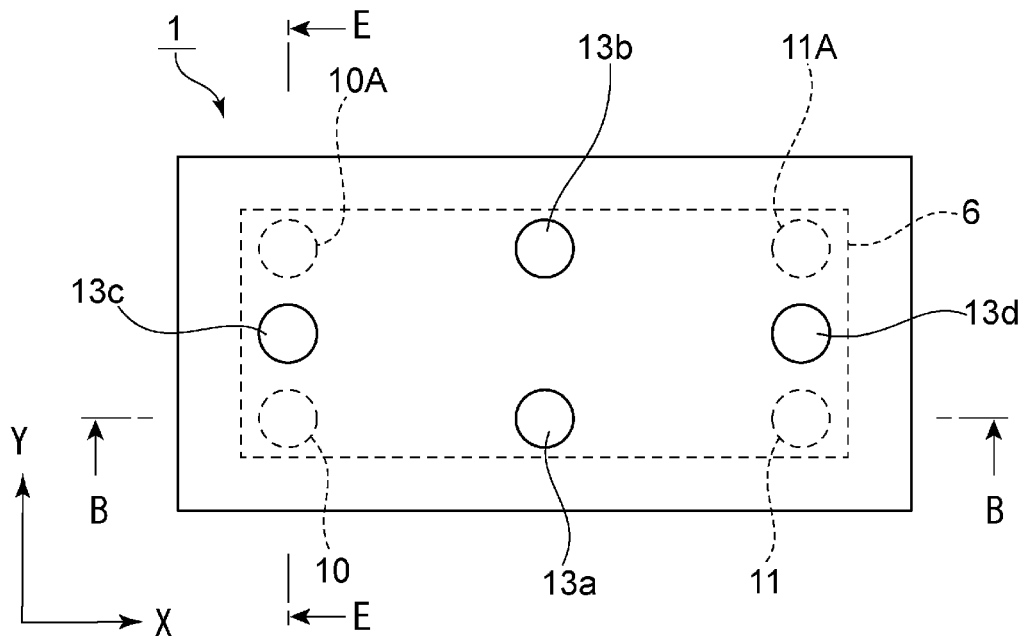
FIGS. 1A and 1B are a plan view of an elastic wave device according to a first preferred embodiment of the present invention and a cross-sectional view taken along a line B-B in FIG. 1A, respectively.
Figure 1B:
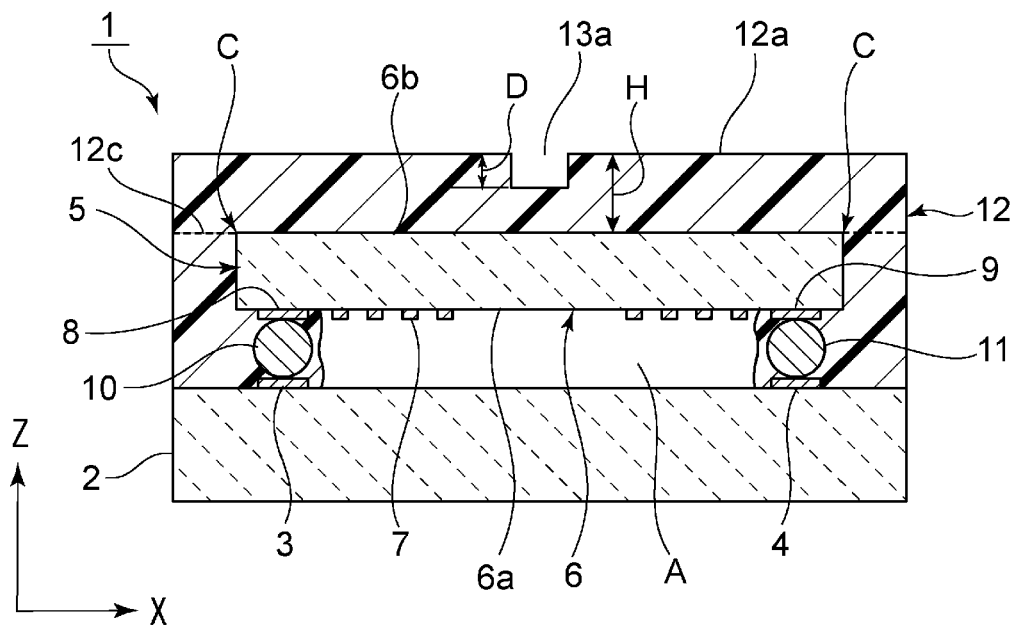

FIGS. 1A and 1B are a plan view of an elastic wave device according to a first preferred embodiment of the present invention and a cross-sectional view taken along a line B-B in FIG. 1A, respectively.

The elastic wave device 1 includes a mounting substrate 2. The mounting substrate 2 is preferably made of insulative ceramics such as alumina, or from semiconductor ceramics, for example. However, the mounting substrate 2 may be made of a material other than ceramics.

A plurality of electrode lands 3 and 4 are provided on an upper surface of the mounting substrate 2. The electrode lands 3 and 4 are made of a suitable metal such as Al, Cu, Ag, or an alloy thereof, for example.

An elastic wave element 5 is mounted on the mounting substrate 2. The elastic wave element 5 includes a piezoelectric substrate 6. The piezoelectric substrate 6 is preferably made of a piezoelectric single-crystal, such as lithium tantalate or lithium niobate, for example. However, the piezoelectric substrate 6 may also be made of piezoelectric ceramics. The piezoelectric substrate 6 includes a first main surface 6a and a second main surface 6b that are opposite to each other. Interdigital transducer electrodes 7 are provided on the first main surface 6a. A hollow portion A facing the interdigital transducer electrodes 7 is provided between the first main surface 6a and the mounting substrate 2.

Electrode lands 8 and 9, which are electrically connected to the interdigital transducer electrodes 7, are provided on the first main surface 6a. The electrode lands 8 and 9 are bonded to the electrode lands 3 and 4 using bumps 10 and 11, respectively. The electrode lands 8 and 9 are preferably made of a suitable metal or alloy, for example. The bumps 10 and 11 are preferably made of a suitable metal, such as solder or Au, for example.

The elastic wave device 1 is disposed such that the first main surface 6a of the piezoelectric substrate 6 faces the mounting substrate 2. The hollow portion A is provided as a result.

A sealing resin layer 12 is provided so as to cover the periphery of the elastic wave element 5 in order to seal the elastic wave element 5.

The sealing resin layer 12 is preferably made of a suitable synthetic resin, such as epoxy resin, for example.

The sealing resin layer 12 preferably is provided so as to cover the elastic wave element 5, with the exception of the hollow portion A.

A recessed portion 13a is provided in a surface 12a of the sealing resin layer 12 on a side opposite to the side facing the mounting substrate 2, the recessed portion 13a is preferably about 10% of the dimension of the surface 12a in the X direction thereof, for example. As illustrated in FIG. 1A, in the present preferred embodiment, a plurality of recessed portions 13a to 13d are preferably provided, for example. In FIG. 1A, the positions of bumps 10, 11, 10A, and 11A provided below the sealing resin layer 12 are indicated by broken line circles. In other words, the bumps 10 and 11 are located on both sides of the recessed portion 13a. Similarly, the bumps 10A and 11A are located on both sides of the recessed portion 13b. In the present preferred embodiment, the sealing resin layer 12 and the piezoelectric substrate 6 preferably have rectangular or substantially rectangular planar shapes, each including long sides and short sides. The bumps 10 and 11 are located at one end side and the other end side of one of the long sides of the piezoelectric substrate 6, respectively. The recessed portion 13a is located in the center or approximate center of this long side. The bumps 10A and 11A are located at one end side and the other end side of the other long side, respectively. The recessed portion 13b is located in the center or approximate center of this long side. In addition, the recessed portion 13c is located in the center or approximate center of the short side on which the bumps 10 and 10A are located. Similarly, the recessed portion 13d is located in the center or approximate center between the bumps 11 and 11A on the other short side.

That is, the recessed portions 13a to 13d are located between corresponding pairs of adjacent bumps.

The depth of the recessed portions 13a to 13d, or in other words, the dimension from the surface 12a of the sealing resin layer 12 on the side opposite to the side facing the mounting substrate 2, to bottom surfaces of the recessed portions 13a to 13d, is referred to as a depth D. On the other hand, a distance between the surface 12a of the sealing resin layer 12 on the side opposite to the side facing the mounting substrate 2, and the second main surface 6b of the piezoelectric substrate 6, is referred to as H. A ratio D/H of the depth D to the distance H is preferably set to be no less than about 1/3, for example. As such, with the elastic wave device 1, the recessed portions 13a to 13d make it possible to reduce stress exerted on lengthwise direction end portions C of the elastic wave element 5 when thermal stress is exerted thereon. This makes it possible to reduce or prevent a situation in which the elastic wave element 5 including the piezoelectric substrate 6 breaks down. This will be described in detail based on an experimental example.

Figure 2:
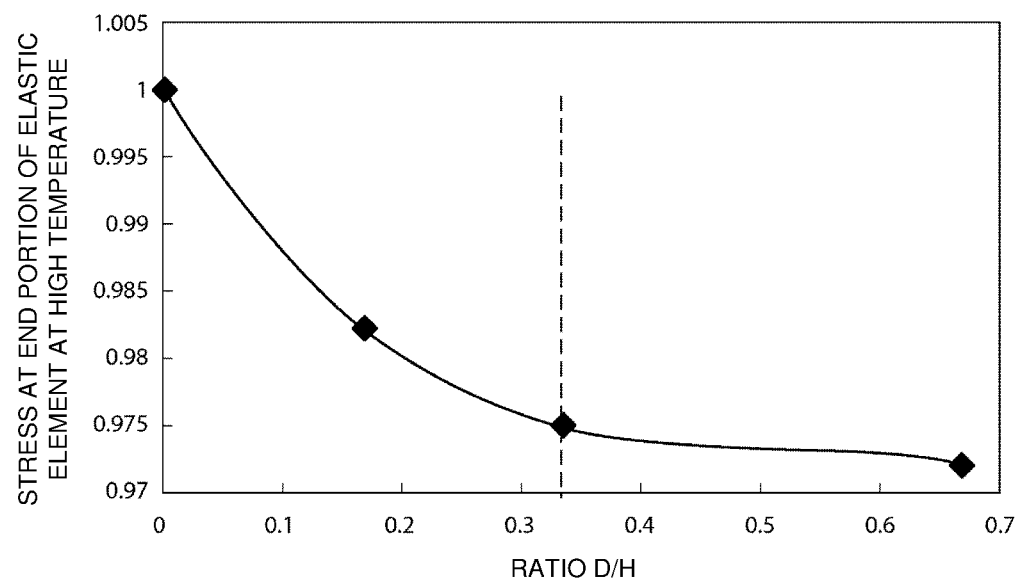
FIG. 2 is a graph illustrating a relationship between a ratio D/H and stress exerted on a lengthwise direction end portion of an elastic wave element when the element is at a temperature of about 85° C., for example.

FIG. 2 is a diagram illustrating, in the elastic wave device 1 according to the present preferred embodiment, a relationship between the ratio D/H and stress exerted on the lengthwise direction end portions of the elastic wave element 5 at a temperature of about 85° C. in cases in which the ratio D/H between the depth D of the recessed portions 13a to 13d and the distance H is varied. Note that this stress in the lengthwise direction end portions is a value obtained using a finite element method to determine the stress at the lengthwise direction end portions C of the piezoelectric substrate 6 in a state in which the elastic wave device 1 has reached a steady state at about 85° C., for example.

As indicated in FIG. 2, it can be seen that the stress exerted on the stated end portions is effectively reduced in cases in which the ratio D/H is no less than about 1/3, for example.

It is therefore preferable that the depth D of the recessed portions 13*a* to 13*d* be such that the ratio D/H is no less than about 1/3, for example. Note that an upper limit for the stated ratio D/H is not particularly limited as long as the stress exerted on the end portions is reduced or prevented. Ultimately, the distance between the surface 12*a* and the second main surface 6*b* of the piezoelectric substrate 6 defines an upper limit for D. s such, the value of the ratio D/H is no greater than about 1, for example. Preferably, the value of the ratio D/H is less than about 1, for example. In this case, a portion of the sealing resin layer will be present between base portions of the recessed portions 13*a* to 13*d* and the second main surface 6*b* of the piezoelectric substrate 6. This makes it possible to even more effectively reduce or prevent a decrease in the mechanical strength.

In the elastic wave device 1 according to the first preferred embodiment, all of the recessed portions 13*a* to 13*d* have the same or substantially the same depth. Preferably, in the case in which a plurality of recessed portions are provided, the recessed portions have different depths. This will be described with reference to FIGS. 3 and 4.

Figure 3:
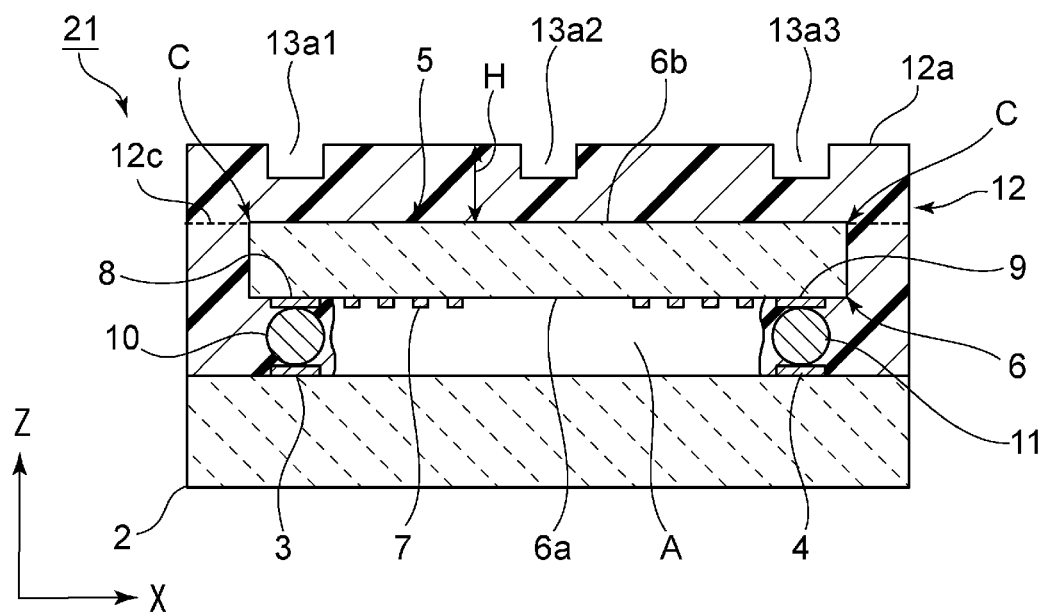
FIG. 3 is a front cross-sectional view of an elastic wave device according to a second preferred embodiment of the present invention.
Figure 4:
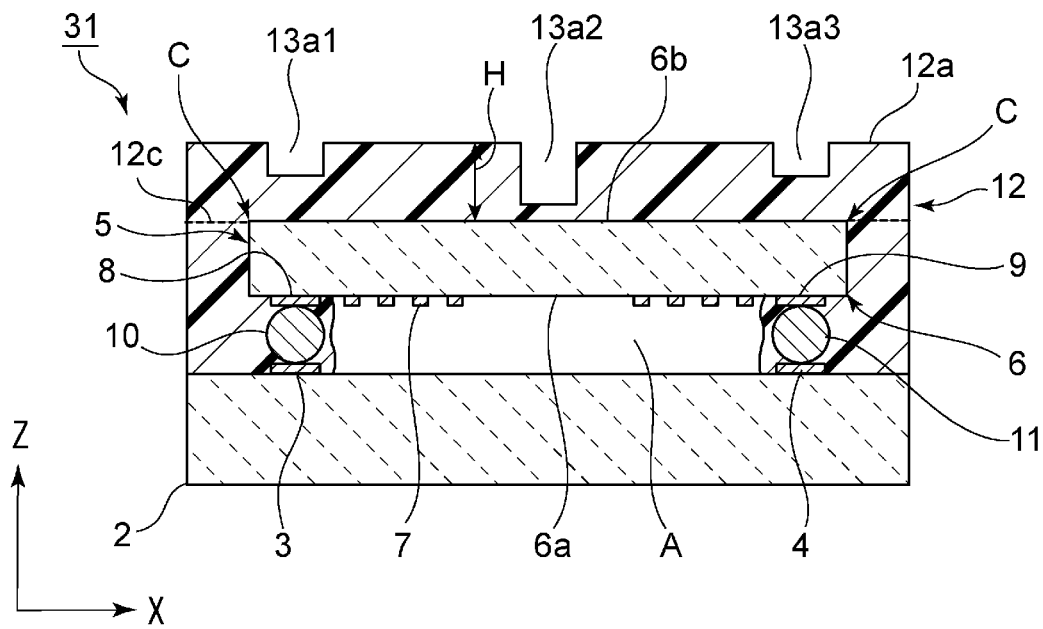
FIG. 4 is a front cross-sectional view of an elastic wave device according to a third preferred embodiment of the present invention.

FIG. 3 is a front cross-sectional view of an elastic wave device 21 according to a second preferred embodiment of the present invention, and FIG. 4 is a front cross-sectional view of an elastic wave device 31 according to a third preferred embodiment of the present invention. FIGS. 3 and 4 are diagrams corresponding to FIG. 1B described in the first preferred embodiment. The difference is that three recessed portions 13*a*1 to 13*a*3 are provided in the surface 12*a* of the sealing resin layer 12, along the lengthwise direction of the piezoelectric substrate 6. Although not illustrated in FIGS. 3 and 4, three recessed portions are also preferably provided in the long side area on the side where the recessed portion 13*b* is provided, as illustrated in FIG. 1A.

In the second preferred embodiment, the recessed portions 13*a*1 to 13*a*3 all have the same or substantially the same depth D, in the same or substantially the same manner as in the first preferred embodiment. As opposed to this, in the elastic wave device 31 according to the third preferred embodiment, the recessed portion 13*a*2 located in the center or approximate center of the lengthwise direction of the piezoelectric substrate 6 is relatively deep, whereas the recessed portions 13*a*1 and 13*a*3 located on one end side and the other end side, respectively, in the lengthwise direction are relatively shallow. The depth of the recessed portion 13*a*1 is preferably the same or substantially the same as the depth of the recessed portion 13*a*3.

In other aspects, the elastic wave devices 21 and 31 according to the second and third preferred embodiments are the same or substantially the same as the elastic wave device 1 according to the first preferred embodiment. These devices are able to therefore reduce stress exerted on the lengthwise direction end portions C of the piezoelectric substrate 6 at high temperatures, in the same or similar manner as the elastic wave device 1 according to the first preferred embodiment.

Figure 5:
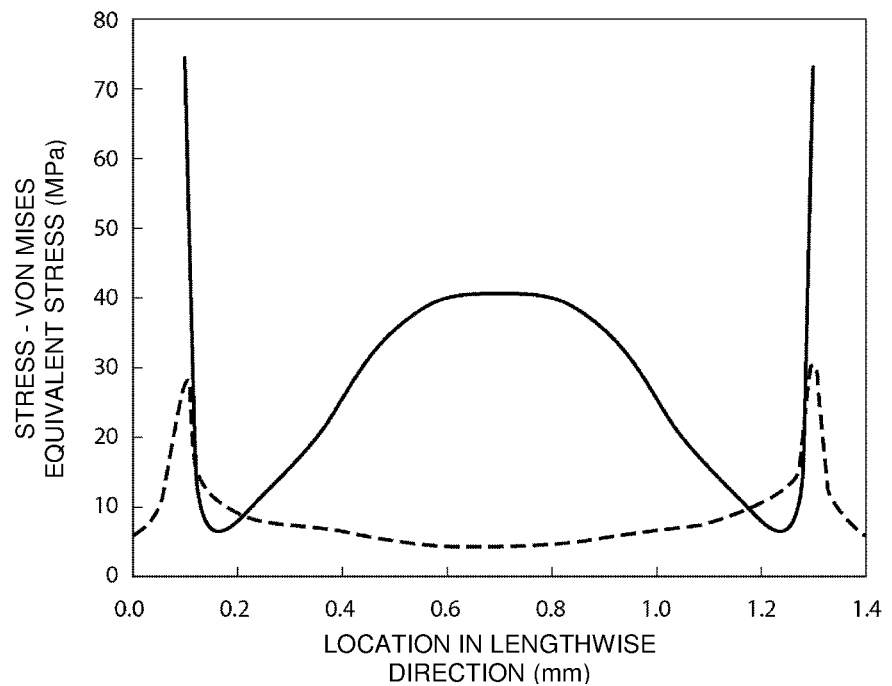
FIG. 5 is a graph illustrating a relationship between lengthwise direction positions of a piezoelectric substrate and a sealing resin layer, and stress exerted under a high temperature, in the elastic wave device according to the second preferred embodiment of the present invention.
Figure 6:
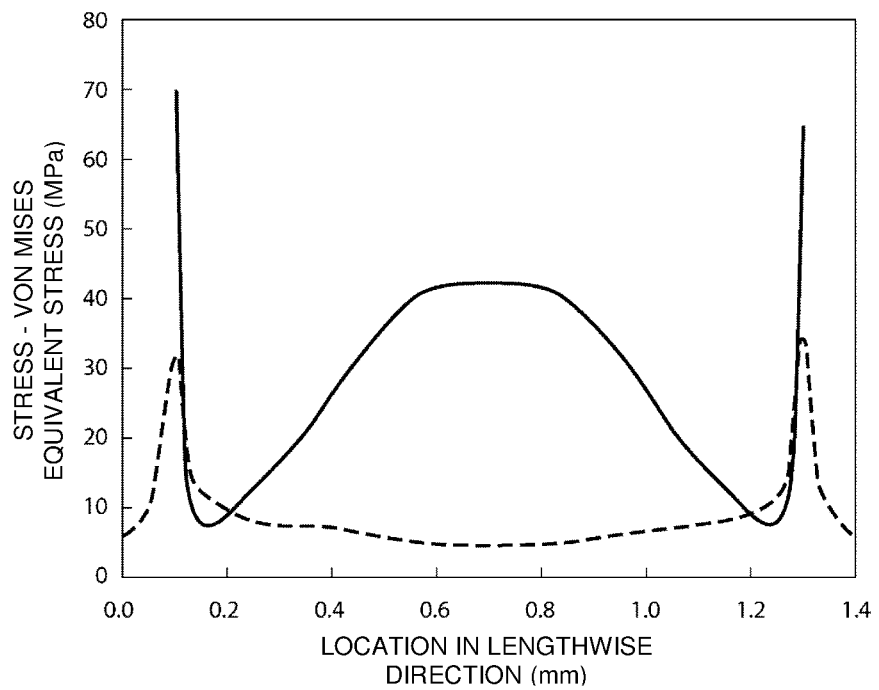
FIG. 6 is a graph illustrating a relationship between lengthwise direction positions of a piezoelectric substrate and a sealing resin layer, and stress exerted under a high temperature, in the elastic wave device according to the third preferred embodiment of the present invention.

FIGS. 5 and 6 are diagrams illustrating relationships between locations in the lengthwise direction (X direction) in the cross-sections of the elastic wave devices 21 and 31 according to the second and third preferred embodiments illustrated in FIGS. 3 and 4, and stress-von Mises equivalent stress. In FIGS. 5 and 6, the solid line indicates stress exerted on the piezoelectric substrate 6 at the second main surface 6*b* of the piezoelectric substrate 6, whereas the broken line indicates stress exerted on the sealing resin layer in a plane 12*c* that includes the second main surface 6*b* of the piezoelectric substrate 6.

Note that the von Mises equivalent stress a $\sigma_{mises}$ is determined through the following formula.

$$\sigma_{mises} = \sqrt{\frac{1}{2}\left\{\begin{array}{l}(\sigma_{yy}-\sigma_{zz})^2+(\sigma_{zz}-\sigma_{xx})^2+\\(\sigma_{xx}-\sigma_{yy})^2+6(\tau_{yz}^2+\tau_{zx}^2+\tau_{xy}^2)\end{array}\right\}}$$ Formula 1

$$= \sqrt{\frac{1}{2}((\sigma_2-\sigma_3)^2+(\sigma_3-\sigma_1)^2+(\sigma_1-\sigma_2)^2)}$$

$\sigma_{xx}, \sigma_{yy}, \sigma_{zz}, \tau_{yz}, \tau_{zx}, \tau_{xy}$: stress tensor component;
$\sigma_1$: maximum principle stress;
$\sigma_2$: median principle stress; $\sigma_3$: minimum principle stress.

As indicated in FIGS. 5 and 6, it can be seen that in both cases, a large amount of stress is exerted on the lengthwise direction end portions of the piezoelectric substrate 6 at locations about 0.1 mm from the end portion of the sealing resin indicated by 0 on the horizontal axis, due to thermal stress at a high temperature. It can furthermore be seen that in the plane 12*c* including the sealing resin layer 12 and the second main surface 6*b* of the piezoelectric substrate 6, a stress of approximately 65 MPa to approximately 75 MPa is exerted on a lengthwise direction location of about 0.1 mm on the horizontal axis, which corresponds to the lengthwise direction end portion of the piezoelectric substrate 6; this stress is greater than the stress exerted on the other locations in the lengthwise direction.

However, as can be seen by comparing FIGS. 5 and 6, the stress at the lengthwise direction end portions of the piezoelectric substrate 6 is approximately 70 MPa and approximately 65 MPa in FIG. 6, for example, which is lower than in the case indicated in FIG. 5. In FIG. 6, the stress on the center or approximate center in the lengthwise direction is greater than in the case indicated in FIG. 5, at approximately 40 MP to approximately 45 MPa, for example. A stress difference between the stress at the locations of both ends of the second main surface 6*b* of the piezoelectric substrate 6 in FIG. 6, and the stress at the location of the center or approximate center, is lower than the corresponding stress difference in the case indicated in FIG. 5.

Accordingly, as is clear from FIG. 6, with the elastic wave device 31 according to the third preferred embodiment, the large amount of stress at the lengthwise direction end portions is able to be reduced, and the stress across the entire piezoelectric substrate 6 in the lengthwise direction is more uniform. Thus, in the case in which the plurality of recessed portions 13*a*1 to 13*a*3 are positioned along the lengthwise direction of the piezoelectric substrate 6, it is preferable for the recessed portion 13*a*2 in the center or approximate center to be relatively deep, as with the elastic wave device 31 according to the third preferred embodiment. In this case as well, it is preferable for the depth D of each of the recessed portions 13*a*1 to 13*a*3 to be set such that the ratio D/H is no less than about 1/3, for example. Note that it was confirmed that the stress distribution state indicated in FIGS. 5 and 6 achieves the same or similar effects in a widthwise direction of the piezoelectric substrate 6, more specifically, in an E-E cross-section indicated in FIG. 1A, which passes through the bumps 10 and 10A and the recessed portion 13c illustrated in FIGS. 1A and 1B.

Figure 7:
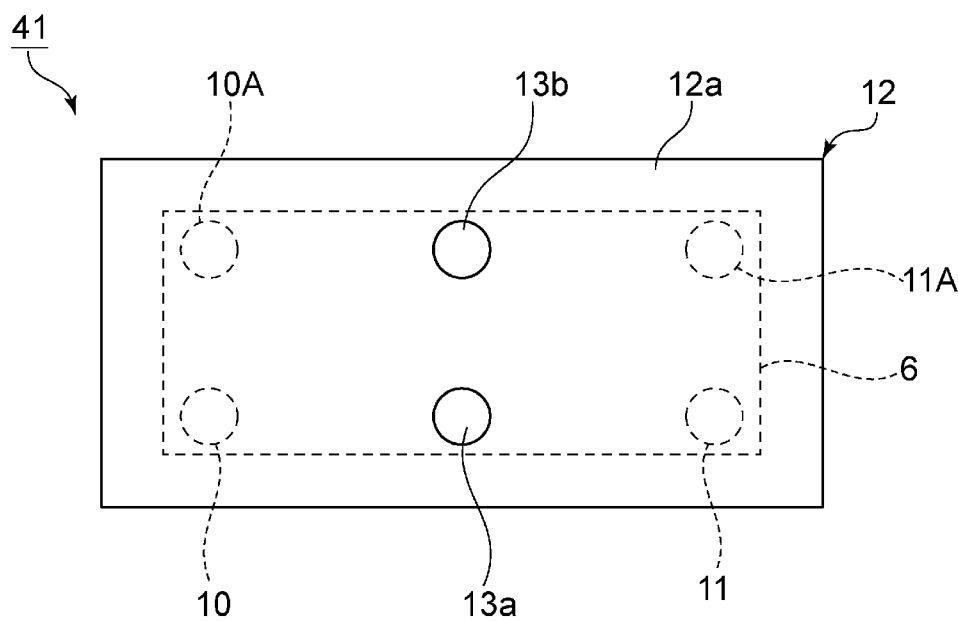
FIG. 7 is a plan view of an elastic wave device according to a fourth preferred embodiment of the present invention.

FIG. 7 is a plan view of an elastic wave device 41 according to a fourth preferred embodiment of the present invention. Here, the recessed portions 13a and 13b are provided at or near the centers, in the lengthwise direction, of both of the long sides of the piezoelectric substrate 6. In this manner, the location in which the recessed portions are provided, and the number thereof, are not particularly limited in the present invention. However, recessed portions are preferably provided between corresponding pairs of the bumps 10, 11, 10A, and 11A that are adjacent to each other, as in the first preferred embodiment, which makes it possible to more effectively improve the mechanical strength of the elastic wave device 1.

Further, when viewed in plan view from the surface 12a side, the recessed portions provided in the upper surface of the sealing resin layer 12 are preferably provided in locations that do not overlap with the hollow portion A located therebelow. More preferably, the recessed portions are provided so as not to overlap with the interdigital transducer electrodes 7. This makes it possible to more effectively improve the mechanical strength of the elastic wave device.

Figure 8:
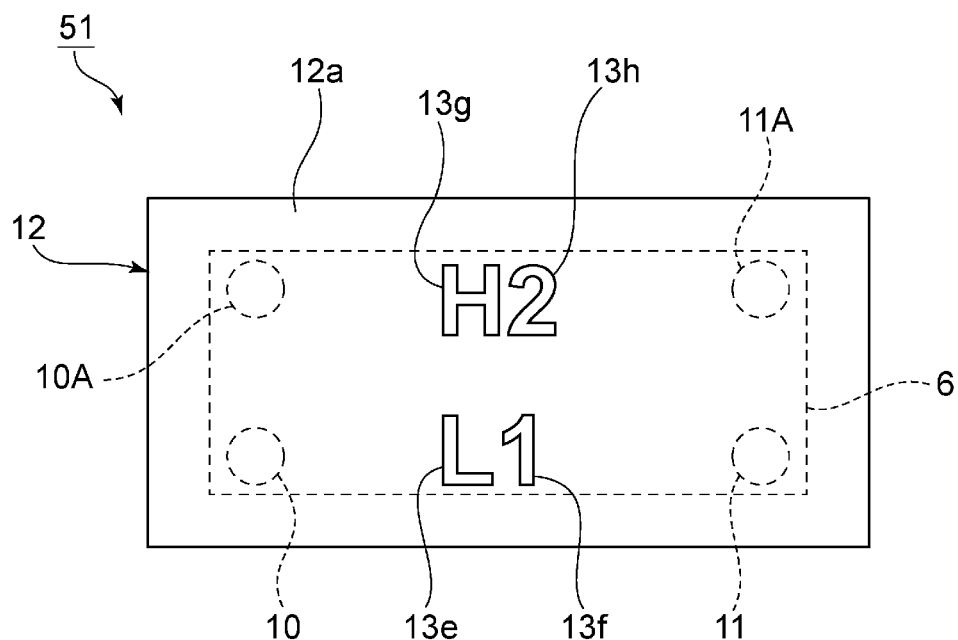
FIG. 8 is a plan view of an elastic wave device according to a fifth preferred embodiment of the present invention.

Additionally, although the recessed portions 13a to 13d, 13a1 to 13a3 have circular or substantially circular planar shapes in the elastic wave devices 1, 21, 31, and 41, the planar shapes of the recessed portions are not particularly limited, and any desired shapes may be used. Preferably, recessed portions 13e, 13f, 13g, and 13h preferably including alphanumeric characters, or other characters may be provided, as in an elastic wave device 51 according to a fifth preferred embodiment, illustrated in FIG. 8. In this case, alphanumeric characters, or other characters may be defined by the recessed portions 13e to 13h, which makes it possible to provide markings indicating product information, product lot numbers, or other information.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a mounting substrate;
electrode lands provided on the mounting substrate;
an elastic wave element including a piezoelectric substrate with first and second main surfaces opposite to each other and an interdigital transducer electrode provided on the first main surface of the piezoelectric substrate, the elastic wave element being mounted on the mounting substrate such that the first main surface opposes the electrode lands on the mounting substrate with a gap provided therebetween;
a plurality of bumps that bond the elastic wave element to the electrode lands; and
a sealing resin layer that covers the elastic wave element mounted on the mounting substrate and defines a portion of the gap as a hollow portion; wherein
a portion of the sealing resin layer is provided between the first main surface of the piezoelectric substrate and the mounting substrate and is exposed to the hollow portion;
a distance between two of the plurality of bumps in a direction parallel or substantially parallel to the first main surface is greater than a width of the hollow portion in the direction parallel or substantially parallel to the first main surface;
at least one recessed portion is provided in a surface of the sealing resin layer on a side opposite to a side facing the mounting substrate; and
a depth of the at least one recessed portion is no less than about 1/3 of a distance from the second main surface of the piezoelectric substrate to the surface of the sealing resin layer on the side opposite to the side facing the mounting substrate.

2. The elastic wave device according to claim 1, wherein when viewed in plan view from the surface of the sealing resin layer on the side opposite to the side facing the mounting substrate, the at least one recessed portion is located between two bumps of the plurality of bumps.

3. The elastic wave device according to claim 2, wherein the at least one recessed portion includes a plurality of recessed portions; and
one of the plurality of recessed portions is located between all of the plurality of the bumps.

4. The elastic wave device according to claim 1, wherein a base of the at least one recessed portion is located closer to the surface of the sealing resin layer on the side opposite to the side facing the mounting substrate than the second main surface of the piezoelectric substrate; and
a portion of the sealing resin layer is disposed between the base of the at least one recessed portion and the second main surface of the piezoelectric substrate.

5. The elastic wave device according to claim 1, wherein when viewed in plan view from the surface of the sealing resin layer on the side opposite to the side facing the mounting substrate, the at least one recessed portion is located outside the hollow portion that faces the interdigital transducer electrode.

6. The elastic wave device according to claim 5, wherein when viewed in plan view from the surface of the sealing resin layer on the side opposite to the side facing the mounting substrate, the at least one recessed portion does not overlap with the interdigital transducer electrode.

7. The elastic wave device according to claim 1, wherein the at least one recessed portion includes at least one of letters, numbers and non-alphanumeric characters.

8. The elastic wave device according to claim 1, wherein the sealing resin layer and the piezoelectric substrate each have rectangular or substantially rectangular planar shapes including long sides and short sides.

9. The elastic wave device according to claim 8, wherein a bump of the plurality of bumps is located at each of one end and another end of one of the long sides of the piezoelectric substrate; and
the at least one recessed portion is located in a center or an approximate center of the one of the long sides.

10. The elastic wave device according to claim 8, wherein the at least one recessed portion includes a plurality of recessed portions; and
each of the plurality of recessed portions is respectively located at a center or an approximate center of each of the long sides and the short sides of the sealing resin layer.

11. The elastic wave device according to claim 1, wherein the at least one recessed portion extends only partially through the sealing resin layer.

12. The elastic wave device according to claim 1, wherein
the at least one recessed portion includes a plurality of recessed portions; and
the depth of each of the plurality of recessed portions is the same or substantially the same.

13. The elastic wave device according to claim 1, wherein
the at least one recessed portion includes a plurality of recessed portions; and
the depth of at least one of the plurality of recessed portions is different from the depth of another one of the plurality of recessed portions.

14. The elastic wave device according to claim 1, wherein the mounting substrate is made of insulative ceramics or semiconductor ceramics.

15. The elastic wave device according to claim 1, wherein the electrode lands are made of Al, Cu, Ag, or an alloy thereof.

16. The elastic wave device according to claim 1, wherein the piezoelectric substrate is made of lithium tantalate or lithium niobate.

17. The elastic wave device according to claim 1, wherein the plurality of bumps are made of solder or Au.

18. The elastic wave device according to claim 1, wherein the sealing resin layer is made of a synthetic resin.

19. The elastic wave device according to claim 18, wherein the sealing resin layer is made of epoxy resin.

* * * * *